(12) United States Patent
Goto (10) Patent No.: US 7,518,389 B2
(45) Date of Patent: Apr. 14, 2009

(54) INTERFACE ASSEMBLY AND DRY GAS ENCLOSING APPARATUS USING SAME

(75) Inventor: Akihiko Goto, Nishitama-gun (JP)

(73) Assignee: Agilent Technologies, Inc., Santa Clara, CA (US)

( * ) Notice: Subject to any disclaimer, the term of this patent is extended or adjusted under 35 U.S.C. 154(b) by 230 days.

(21) Appl. No.: 11/407,479

(22) Filed: Apr. 20, 2006

(65) Prior Publication Data

US 2006/0255821 A1 Nov. 16, 2006

(30) Foreign Application Priority Data

May 16, 2005 (JP) ............................. P2005-142979

(51) Int. Cl.
*G01R 31/02* (2006.01)
*G01R 31/28* (2006.01)

(52) U.S. Cl. ..................... 324/760; 324/754; 324/158.1

(58) Field of Classification Search ........................ None
See application file for complete search history.

(56) References Cited

U.S. PATENT DOCUMENTS

| | | | | |
|---|---|---|---|---|
| 5,550,482 | A * | 8/1996 | Sano | 324/758 |
| 5,944,548 | A | 8/1999 | Saito | 439/248 |
| 5,969,535 | A * | 10/1999 | Saito | 324/758 |
| 5,982,183 | A * | 11/1999 | Sano | 324/754 |
| 6,181,145 | B1 * | 1/2001 | Tomita et al. | 324/754 |
| 6,292,006 | B1 * | 9/2001 | Fredrickson | 324/754 |
| 6,570,397 | B2 * | 5/2003 | Mayder et al. | 324/754 |
| 6,762,616 | B2 | 7/2004 | Kawaguchi et al. | 324/765 |
| 7,129,730 | B2 * | 10/2006 | Liu et al. | 324/758 |
| 7,285,968 | B2 * | 10/2007 | Eldridge et al. | 324/754 |

FOREIGN PATENT DOCUMENTS

| | | |
|---|---|---|
| JP | 10-106677 | 4/1998 |
| JP | 11-026523 | 1/1999 |

\* cited by examiner

*Primary Examiner*—Ha Tran T Nguyen
*Assistant Examiner*—Roberto Velez
(74) *Attorney, Agent, or Firm*—Marc Bobys (57) ABSTRACT

An interface assembly provided at a test head, for connecting a probe card to the test head. The interface assembly includes an interface comprising an interface body and a coaxial connector supported by the interface body, and a casing for enclosing a dry gas that is introduced between the test head and the probe card and leaks into the test head through a gap formed by the interface (20) in a state where the coaxial connector is engaged with a mating coaxial connector provided at the probe card. An interface assembly provided at a test head, for connecting a probe card to the test head, the interface assembly comprising: an interface comprising an interface body and a coaxial connector supported by the interface body; and a cover member provided at the interface, for enclosing a dry gas that is introduced between the test head and the probe card and leaks into the test head through a gap formed by the interface in a state where the coaxial connector is engaged with a mating coaxial connector provided at the probe card.

4 Claims, 7 Drawing Sheets

INTERFACE ASSEMBLY AND DRY GAS ENCLOSING APPARATUS USING SAME

FIELD OF THE INVENTION

The present invention relates to an interface assembly for mechanically connecting coaxial connectors to each other and a dry gas enclosing apparatus using such interface assembly. In particular, the present invention relates to an interface assembly for connecting a test head and a probe card via coaxial connectors in a semiconductor tester and to a dry gas enclosing apparatus using such interface assembly.

DISCUSSION OF THE BACKGROUND ART

In a semiconductor test apparatus, inspection of semiconductor devices is conducted by bringing a probing needle of a probe card or a contact probe such as a membrane probe into contact with electrode pads of multiple semiconductor devices formed on a wafer, applying a test signal from a test head, and detecting output signals from the semiconductor devices.

The inspection of semiconductor devices is conducted by adjusting the atmosphere temperature to a temperature matching the conditions at which the semiconductor devices are used. Therefore, the inspection is conducted not only in a high-temperature atmosphere, but also in a low-temperature atmosphere. When the inspection is conducted by setting an atmosphere temperature to a low temperature, condensation sometimes occurs on the periphery of wafer or probe card. When condensation occurs on the wafer or probe card, it causes degradation of electric characteristics such as short circuit of exposed wiring patterns or leak increase and also contaminates the surface. For this reason, an apparatus for introducing a dry gas to the probe card surface (for example, Japanese Patent Applications Laid-open No. 11-026523) or an apparatus for introducing a dry gas around a wafer (for example, Japanese Patent Applications Laid-open No. 2003-179109) have been used in the semiconductor test apparatuses to prevent the occurrence of condensation.

The progress recently achieved in the field of semiconductor devices that are the objects of measurement created a demand for improved performance of semiconductor test equipment. In particular, when measurements are conducted to determine the capacity of gate insulating film, evaluate strain characteristics of transistors, and evaluate RF characteristics of transistors, the frequency of signals employed in the measurements extends to a HF band or RF band and measurements in the high-frequency bands become necessary.

Pogo pins are generally used for electric connection of a test head and a probe card in a semiconductor test apparatus. Pogo pins are also called connector pins, probe pins, and spring pins and they can maintain the measurement accuracy when used for measuring DC signals or low-frequency signals.

However, when high-frequency signals in a HF band or RF band are measured, the measurement accuracy is difficult to maintain with the pogo pins due to a reflection loss or the like. Accordingly, when high-frequency signals in a HF band or RF band are measured, coaxial connectors for HF or RF signals have to be used in the connection portions of the test head and probe card.

Engagement of coaxial connectors is usually conducted by manually attaching coaxial cables one by one to coaxial connectors. However, the applicant has invented and patented a connector that enables automatic engagement even of coaxial connectors (Japanese Patent Applications Laid-open No. 10-106677). In the case where coaxial connectors capable of automatic engagement are provided at an interface for connecting a test head and a probe card and the interface is employed in a semiconductor test apparatus in which a dry gas can be introduced between the test head and probe card, the following problems are encountered.

SUMMARY OF THE INVENTION

When a test head and a probe card are connected by using an interface having coaxial connectors that can be automatically engaged, a structure enabling the automatic engagement of coaxial connectors is required for the interface. Due to such structure, air tightness between the test head and probe card is degraded.

Here, a discharge fan for discharging the air present inside the test head to the outside in order to cool the inside of the test head with air is provided inside the test head. Therefore, when a dry gas is introduced between the test head and probe card, the dry gas leaks into the test head due to poor air tightness in the interface and the leaked dry gas is further sucked by the discharge fan provided inside the test head and discharged to the outside of the test head. The resultant problem is that the dry gas present between the test head and probe card is diluted and condensation occurs on the probe card surface.

The present invention was created to resolve the above-described problem and it is an object thereof to prevent the dry gas that was introduced between the test head and probe card and leaked into the test head from being discharged to the outside of the test head when the test head and probe card are connected via coaxial connectors that can be automatically engaged.

In order to achieve above object, the present invention provides an interface assembly provided at a test head for connecting a probe card to the test head. The interface assembly comprises an interface comprising an interface body and a coaxial connector supported by the interface body, and a cover member provided at the interface, for enclosing a dry gas that is introduced between the test head and the probe card and leaks into the test head through a gap formed by the interface in a state where the coaxial connector is engaged with a mating coaxial connector provided at the probe card.

DETAILED DESCRIPTION OF THE PREFERRED EMBODIMENT

An interface assembly 100 and dry gas enclosing apparatus 200 that are the embodiments of the present invention will be described below with reference to the appended drawings.

Figure 1:
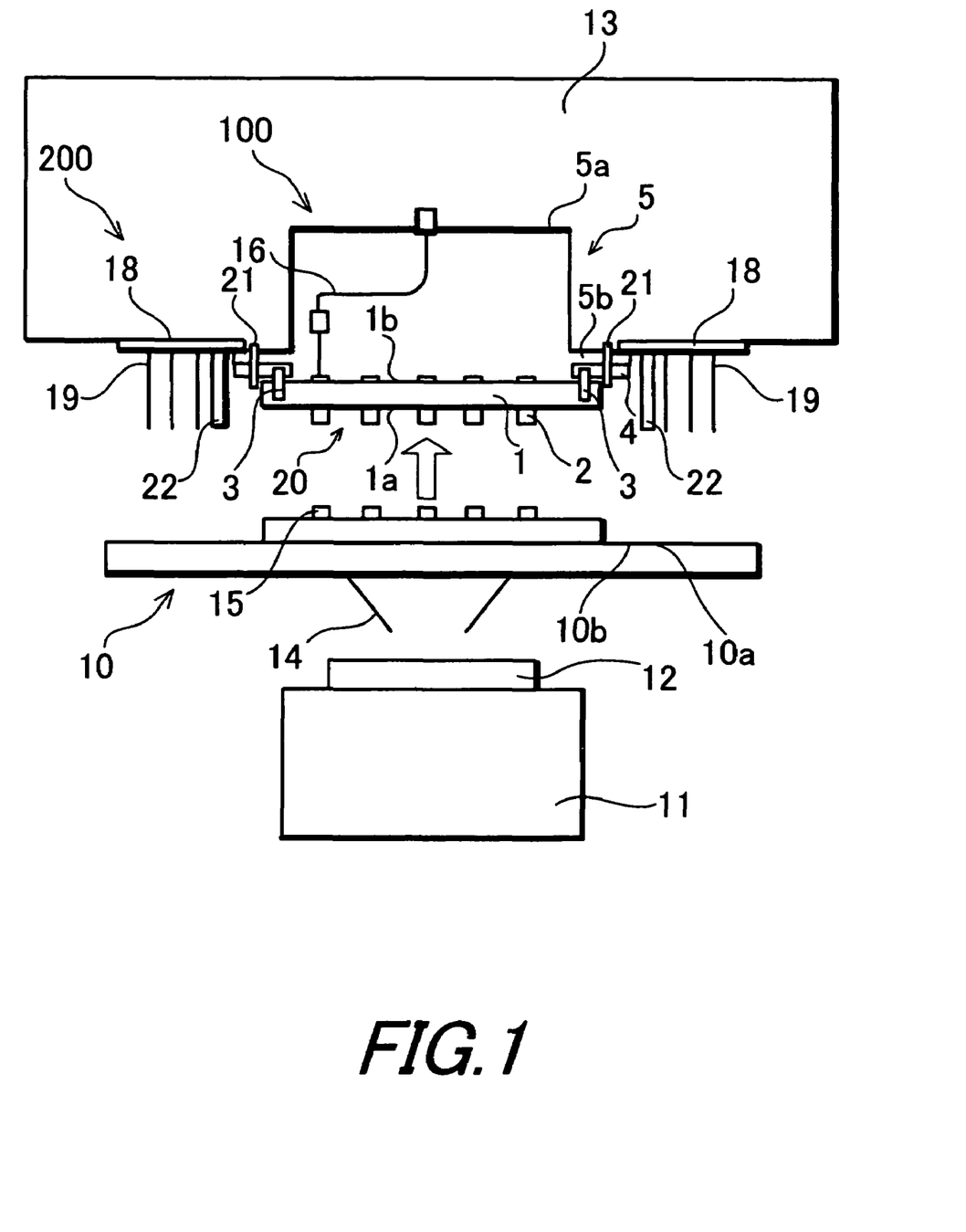
FIG. 1 is a schematic drawing illustrating a connection portion of a test head and a probe card of the semiconductor test apparatus.

A semiconductor test apparatus employing the present invention serves to inspect semiconductor devices formed on a wafer 12 which is a measurement object held in a chuck 11. The semiconductor test apparatus, as shown in FIG. 1, comprises a test head 13 for outputting electric signals to a semiconductor device, processing electric signals from the semiconductor device and measuring the electric characteristics of the wafer 12, a probe card 10 comprising a probing needle 14 to be brought into contact with an electrode pad of the semiconductor device, and an interface 20 for connecting the probe card 10 to the test head 13.

The test head 13 and probe card 10 are electrically connected by engaging coaxial connectors 2 provided at the interface 20 with mating coaxial connectors 15 provided at the probe card 10 and bringing a substrate section 10a of the probe card 10 into contact with pogo pins 19 disposed via an annular base plate 18 around the interface 20. The coaxial connector 2 serves for measuring a high-frequency signal and the pogo pin 19 serves to measure a low-frequency signal.

The inspection of the wafer 12 is conducted under conditions matching the usage conditions of the wafer 12. For this purpose, the inspection is sometimes conducted by setting the ambient temperature around the wafer 12 to a low temperature. In this case, the adjustment of ambient temperature is conducted by supplying an appropriate coolant into a chuck 11.

Setting the ambient temperature around the wafer 12 to a low temperature also reduces the temperature of the probe card 10. For this reason, condensation on the wafer 12 and probe card 10 becomes a problem, but the occurrence of condensation is prevented by introducing a dry gas to the periphery of the wafer 12 and probe card 10.

Figure 2:
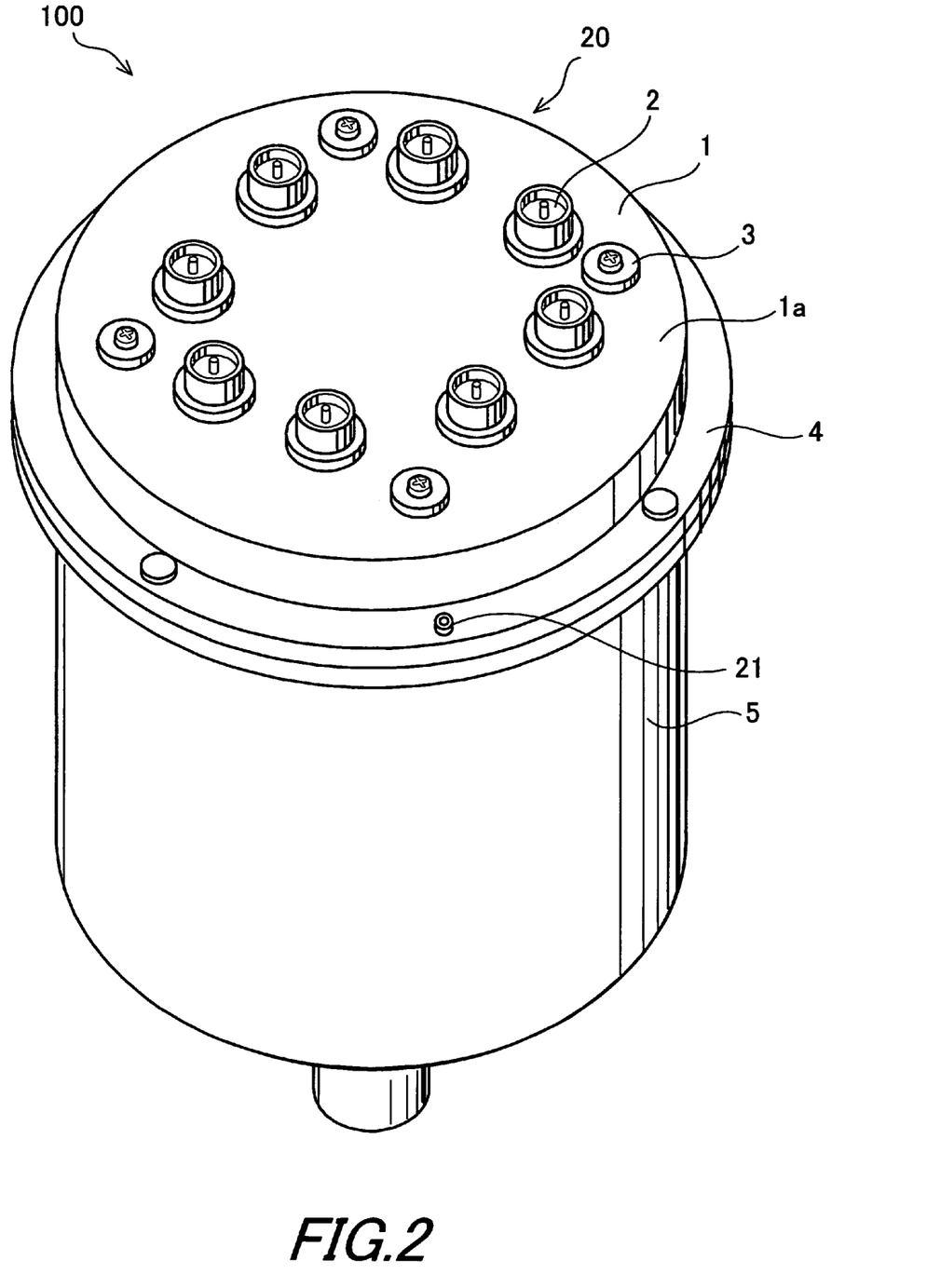
FIG. 2 is a perspective view of an interface assembly 100 of the embodiment of the present invention.
Figure 3:
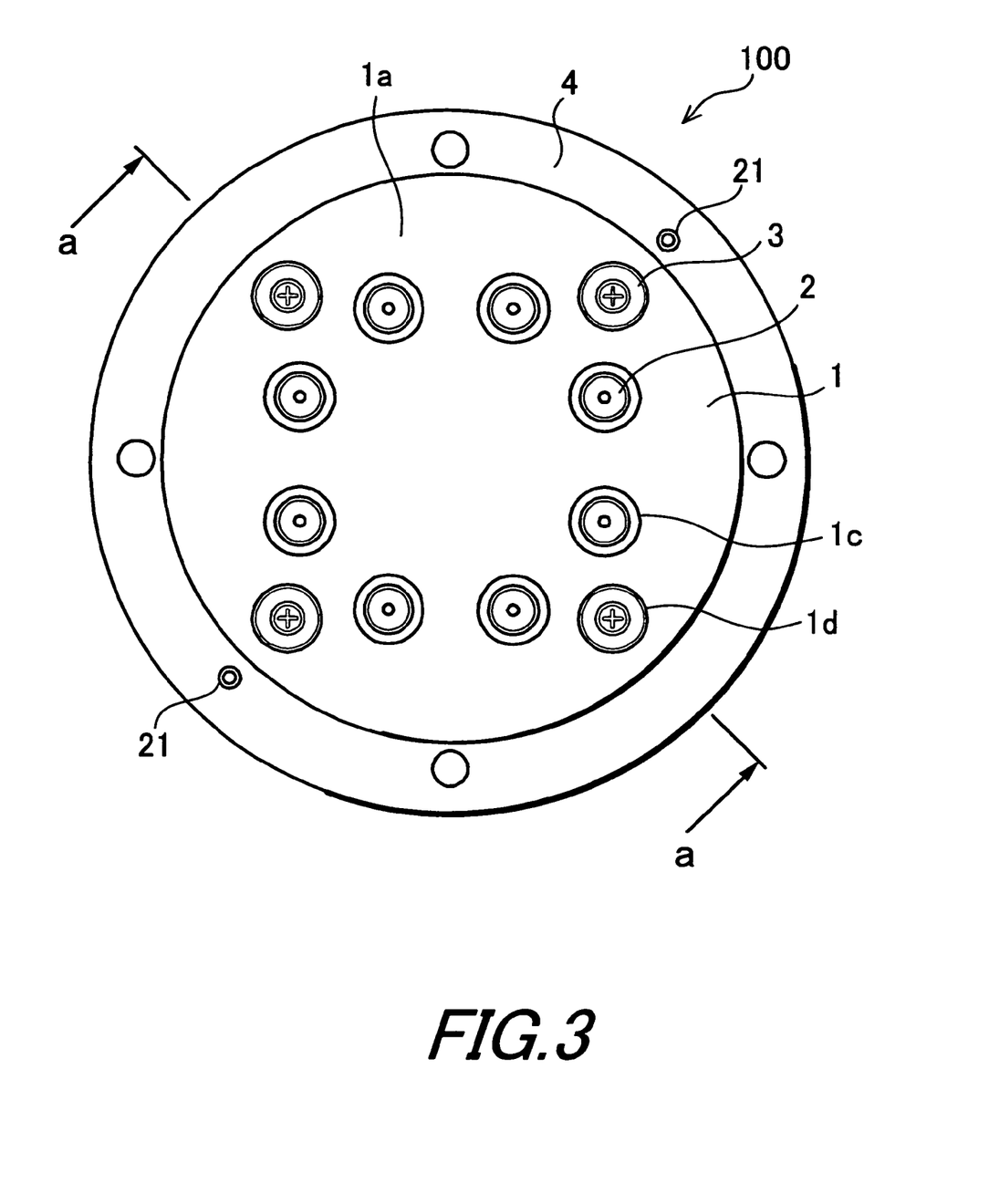
FIG. 3 is a plan view of an interface assembly 100 of the embodiment of the present invention.

The interface assembly 100 comprises the interface 20 for connecting the probe card 10 to the test head 13, a casing 5 serving as a cover member for enclosing a dry gas that is introduced between the test head 13 and probe card 10 and leaks into the test head 13 through a gap formed by the interface 20 in a state where the coaxial connectors 2 of the interface 20 is engaged with the mating coaxial connectors 15 of the probe card 10, a ring plate 4 as an annular member for connecting the interface 20 and the casing 5, and a support mechanism 3 for supporting the interface 20 on the ring plate 4.

The interface 20 comprises an interface body 1, and a plurality of coaxial connectors 2 supported by the interface body 1. The interface 20 is slidably supported on the ring plate 4 by the support mechanism 3.

A plurality of first through holes 1c and a plurality of second through holes 1d having respective openings at the first surface 1a facing the probe card 10 and the second surface 1b opposing the first surface 1a are provided in the interface body 1.

Figure 4:
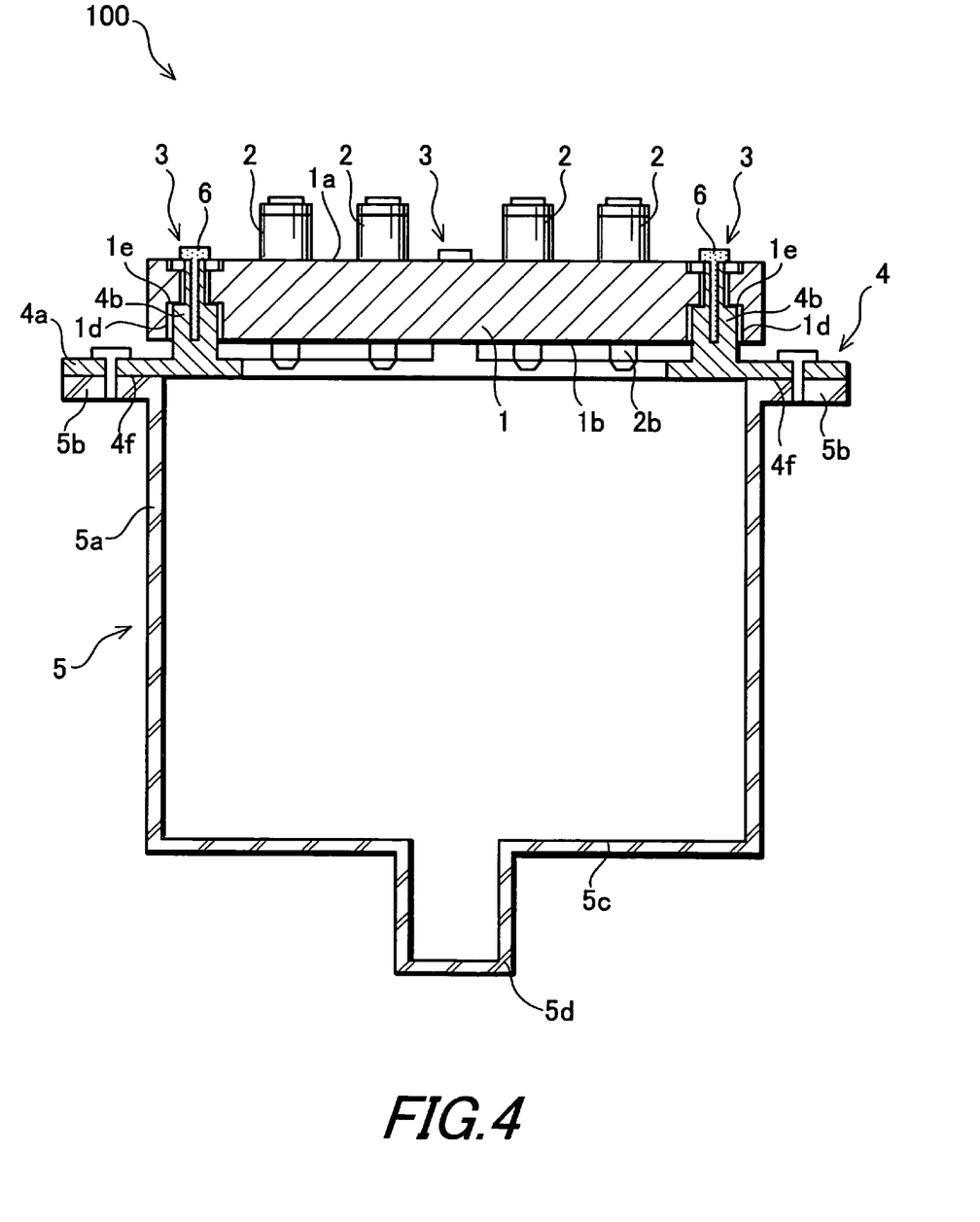
FIG. 4 is a view along the a-a section in FIG. 3.

The first through holes 1c support coaxial connectors 2, and the second through holes 1d support the support mechanism 3. As shown in FIG. 4, a step 1e is provided on the inner peripheral surface of the second through hole 1d. In the present embodiment, the interface body 1 is shown to have a cylindrical shape, but this shape is not limiting.

Figure 5A:
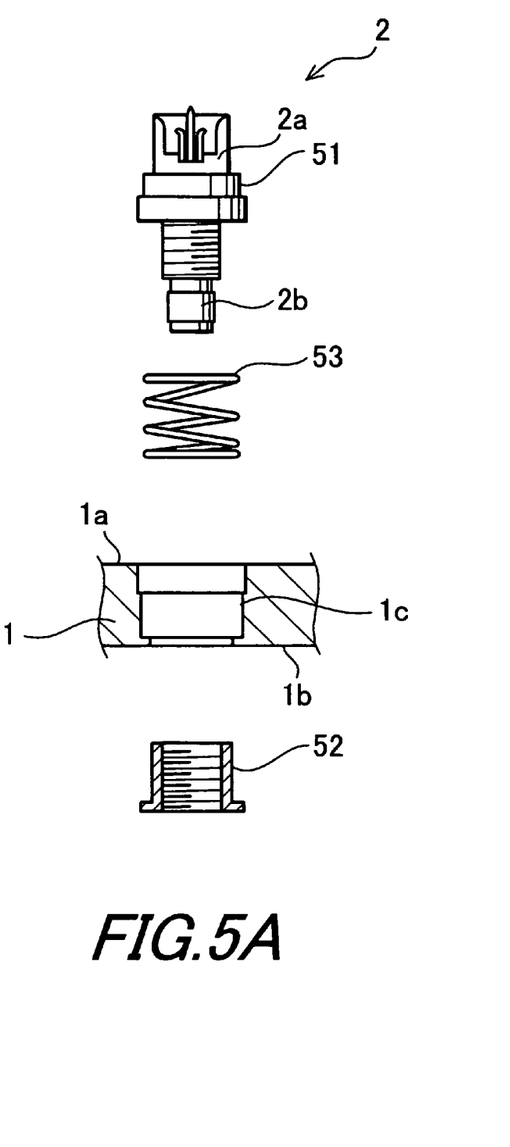
FIGS. 5A and 5B illustrate a coaxial connector.
Figure 5B:
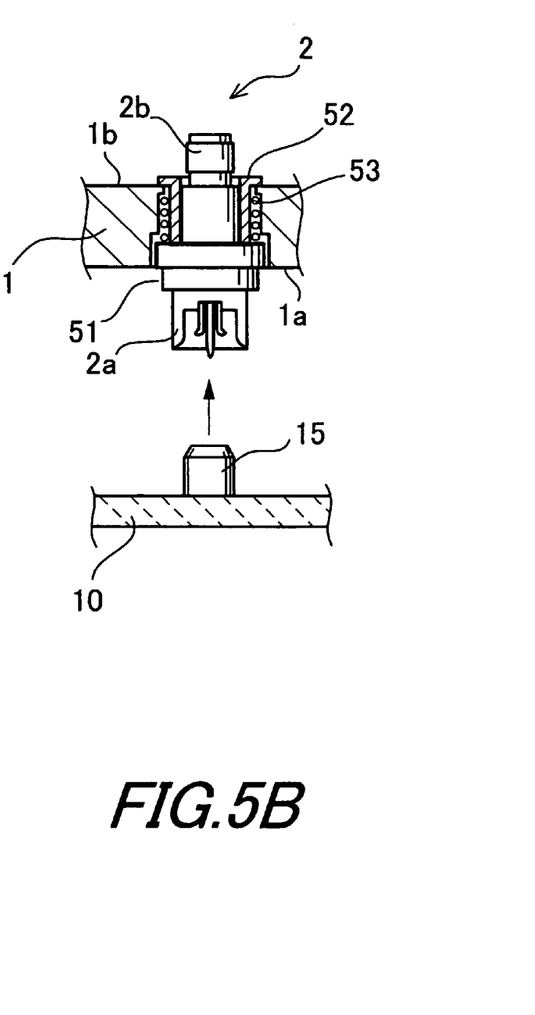

The coaxial connectors 2 will be described below with reference to FIG. 5. FIG. 5A is an exploded view of the coaxial connector 2, and FIG. 5B illustrates a state where the coaxial connector 2 is attached to the interface body 1. The coaxial connector 2 serves to measure high-frequency signals, e.g., of a HF band or RF band and is disposed through the interface body 1.

A connector section 2a protruding from the first surface 1a of the interface body 1 is engaged with the mating coaxial connector 15 provided at the probe card 10, and a coaxial cable 16 leading to the test head 13 is connected to the connector section 2b protruding from the second surface 1b of the interface body 1.

In the coaxial connector 2, as shown in FIG. 5A, a blind mate connector 51 is supported via a flange nut 52 and a coil spring 53 in the first through hole 1c provided in the interface body 1. The blind mate connector 51 is configured to be capable of moving in the vertical direction and horizontal direction.

With the coaxial connector 2 of such configuration, engagement of the coaxial connector 2 with the mating coaxial connector 15 can be conducted by a snap-in system by which the mating coaxial connector 15 is pushed in the axial direction with respect to the coaxial connector 2, as shown in FIG. 5B, without rotating the two coaxial connectors 2 and 15 about the central axis. The engaging force of a set of the coaxial connector 2 and the mating coaxial connector 15 is about 1 kgf. In FIGS. 5A and 5B, the connector section 2a is of a female connection type and the mating coaxial connector 15 is of a male connection type, but the connector section 2a may be of a male connection type and the mating coaxial connector 15 may be of a female connection type.

Figure 6:
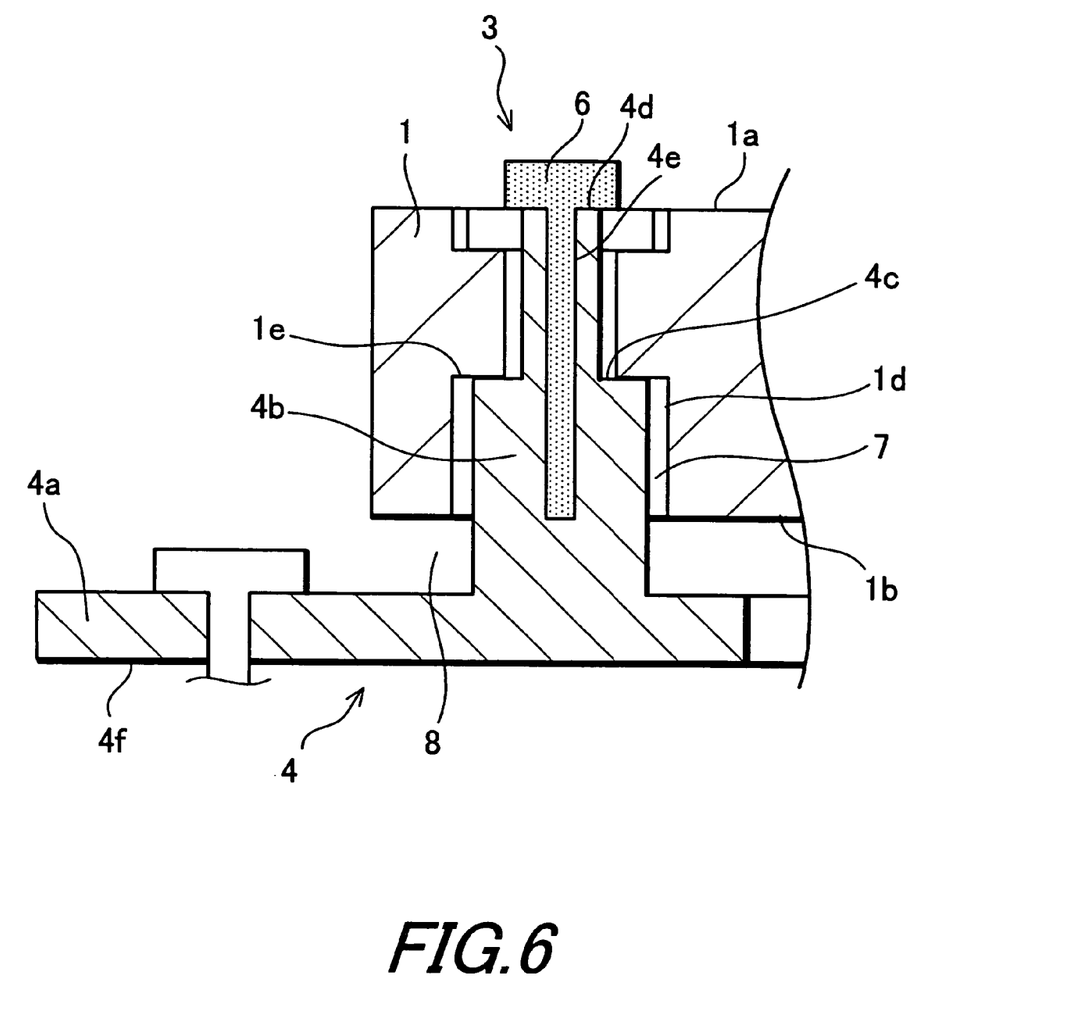
FIG. 6 is an enlarge view of a support mechanism periphery.

The ring plate 4, as shown in FIG. 4 and FIG. 6, comprises an annular plate section 4a with an outer diameter larger than that of the interface body 1 and a support column 4b provided in a position corresponding to the second through hole 1d of the interface body 1 in the plate section 4a.

A step 4c is formed in the support column 4b, an orifice 4e is formed in the apex section 4d of the support column 4b, and a female thread is formed in the orifice 4e. The outer diameter of the support column 4b is less than the inner diameter of the second through hole 1d of the interface body 1. Furthermore, the height from the plate section 4a in the support column 4b to the step 4c is larger than the depth from the second surface 1b in the second through hole 1d to the step 1e.

A method for attaching the ring plate 4 to the interface body 1 will be described below. The support column 4b is inserted from the side of the second surface 1b into the second through hole 1d. As a result, the interface body 1 and ring plate 4 are disposed in a state where the step 1e of the second through hole 1d is in contact with the step 4c of the support column 4b. In this state, the bolt 6 serving as a tightening member is threaded into a female thread of the orifice 4e of the support column 4b. The support mechanism 3 is thus configured by the support column 4b and bolt 6, and the interface 20 is supported on the ring plate 4 by this support mechanism 3.

In a state where the interface 20 is supported on the ring plate 4, the outer diameter of the support column 4b is less than the inner diameter of the second through hole 1d of the interface body 1. Therefore, a gap 7 is present between the support column 4b and second through hole 1d (see FIG. 6 and FIG. 7). Furthermore, because the height of the step 4c of the support column 4b is larger than the height from the second surface 1b in the second through hole 1d to the step 1e, a gap 8 is also present between the interface body 1 and ring plate 4 (see FIG. 6 and FIG. 7).

Thus, the interface 20 is supported by the support mechanism 3 so that gaps 7 and 8 are provided between the interface 20 and the ring plate 4. Therefore, the interface 20 can be supported so that it can slide in the direction (left-right direction in FIG. 4) perpendicular to the support column 4b with respect to the ring plate 4.

The connection of the test head 13 and probe card 10 via the interface 20 is conducted, as shown in FIG. 1, by moving the probe card 10 upward and simultaneously snapping a plurality of mating coaxial connectors 15 of the probe card 10 in a plurality of coaxial connectors 2 of the interface 20. When a plurality of coaxial connectors are thus engaged by one operation, all the coaxial connectors are difficult to engage smoothly in a state where the coaxial connectors of the two groups are fixed.

However, in the case of the interface 20, the coaxial connectors 2 themselves can be moved in the vertical direction and horizontal direction, and the interface 20 supporting the coaxial connector 2 can slide with respect to the probe card 10. Therefore, a plurality of the coaxial connectors 2 of the interface 20 and a plurality of mating coaxial connectors 15 of the probe card 10 can be engaged smoothly by one operation.

Figure 7:
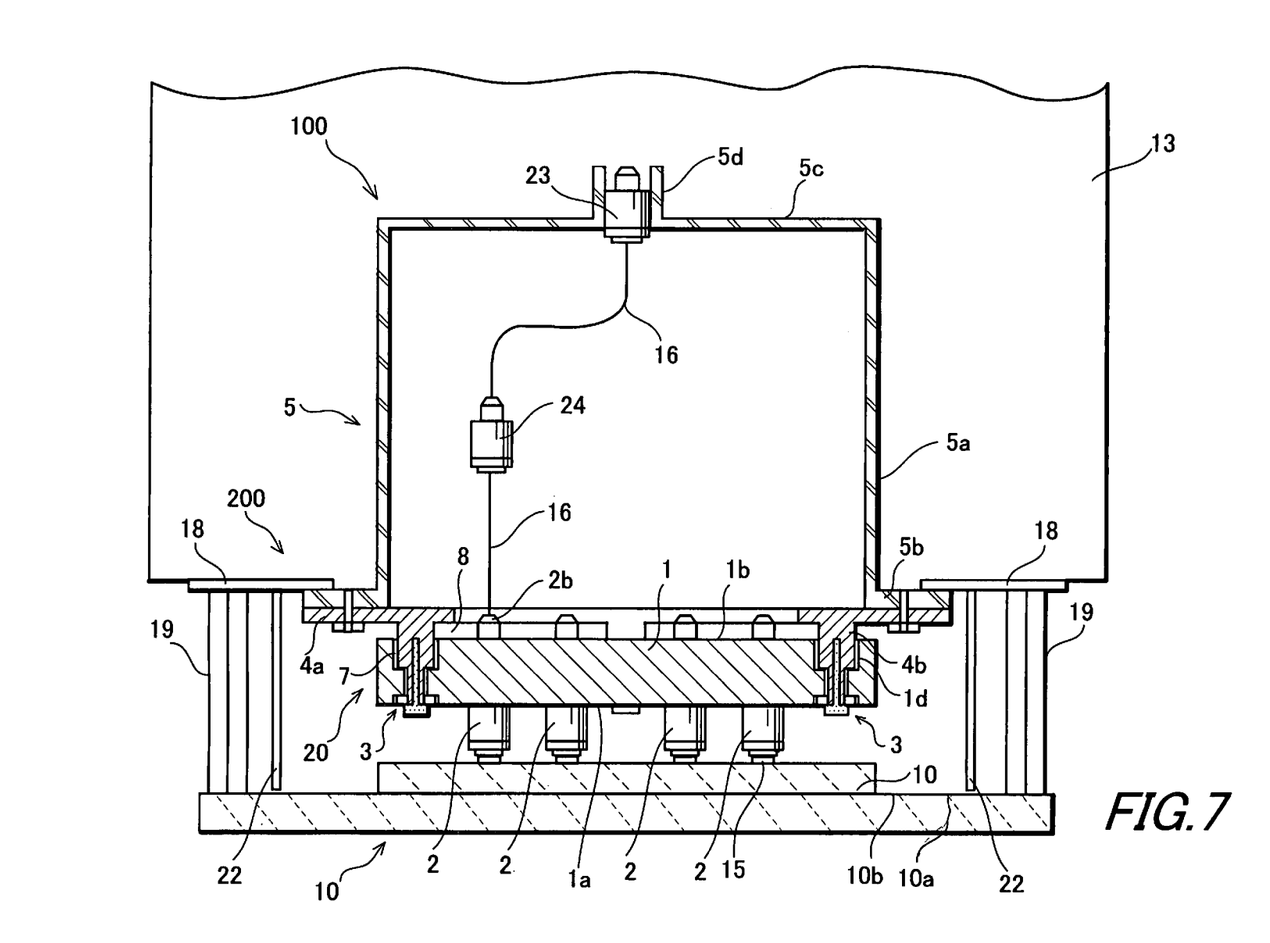
FIG. 7 illustrates the connection state of the test head and probe card.

As shown in FIG. 4 and FIG. 7, the casing 5 is a cap-shaped container comprising a tubular section 5a having an opening at one end thereof and an annular open edge 5b provided at this end. A tubular connector holding section 5d for accommodating a coaxial connector 23 for attaching a measurement probe (not shown in the figure) from an impedance analyzer or the like is formed in an apex section 5c of the casing 5.

The open edge 5b is connected to a surface 4f that is opposite the surface where the support column 4b in the ring plate 4 is provided. The casing 5 is thus connected to the interface 20 via the ring plate 4.

The coaxial connector 23 accommodated in the connector holding section 5d and the connector section 2b of the coaxial connector 2 supported by the interface body 1 are connected by a coaxial cable 16 or the like via the coaxial connector 24. Thus, the coaxial connector 24 or coaxial cable 16 for connecting the interface 20 and the test head 13 is accommodated inside the casing 5. The coaxial connector 23 is also accommodated in the connector holding section 5d, while maintaining the air-tight state.

A dry gas enclosing apparatus 200, as shown in FIG. 1, comprises the interface assembly 100, a nozzle 21 as dry gas introducing means for introducing a dry gas to the periphery of the probe card 10, and a tubular member 22 disposed around the interface 20 and surrounding the space between the test head 13 and probe card 10 in a state where the coaxial connector 2 of the interface 20 and the mating coaxial connector 15 of the probe card 10 are engaged with each other.

The nozzle 21 introduces the dry gas from the dry gas generator (not shown in the figure) between the test head 13 and probe card 10 in order to prevent the occurrence of condensation at the substrate section surface 10b of the probe card 10 which is in contact with the pogo pin 19. The nozzle 21 is disposed inside the tubular member 22 and supported by plate section 4a of the ring plate 4 and open edge 5b of the casing 5. The dry gas is, for example, air.

The tubular member 22 is supported on the base plate 18, as shown in FIG. 7 and is disposed to face the probe card substrate section surface 10b in a state where the coaxial connector 2 and the mating coaxial connector 15 are engaged with each other and the test head 13 and probe card 10 are connected. Therefore, the dry gas introduced between the test head 13 and probe card 10 is enclosed between the test head 13 and probe card 10.

One end of the tubular member 22 is not completely connected to the probe card substrate section surface 10b and a tiny gap is present therebetween. A very small amount of the dry gas leaking form the tiny gap leaks along the probe card substrate section surface 10b on the outer side of the tubular member 22. Therefore, the portion of the probe card substrate section surface 10b that is not surrounded by the tubular member 22 is also maintained in a dry state.

Functions of the interface assembly 100 and a dry gas enclosing apparatus 200 of the above-described configuration will be described below with reference to FIG. 7. FIG. 7 illustrates a state in which the test head 13 and probe card 10 are connected by engaging the coaxial connectors of the interface 20 and probe card 10.

(1) The interface assembly 100 is fixed to the test head 13 via the base plate 18 provided at the test head 13. The attachment of the base plate 18 and interface assembly 100 is conducted by inserting the tubular section 5a of the casing 5 into a central open section of the base plate 18, which is an annular member, and attaching the base plate 18 to the annular open edge 5b of the casing 5. When the pogo pins 19 are not used, the interface assembly 100 may be directly attached to the test head 13 via the casing 5 or ring plate 4.

(2) The test head 13 and probe card 10 are connected by engaging the coaxial connector 2 of the interface 20 with the mating coaxial connector 15 of the probe card 10. In this state, the tubular member 22 is disposed around the interface 20 so as to surround the space between the test head 13 and probe card 10.

(3) A dry gas is introduced between the test head 13 and probe card 10 so as to prevent condensation on the substrate section surface 10b of the probe card 10 in a state where the test head 13 and probe card 10 are connected to each other. The flow of the introduced dry gas is adjusted downward, as shown in the figure by the tubular member 22, and the probe card substrate section surface 10b is dried. However, at the test head side, because gaps are present between the support columns 4a and second through hole 1d of the interface body 1 and between the interface body 1 and ring plate 4, the dry gas leaks into the test head 13 from those gaps.

(4) The dying gas that leaked into the test head 13 is enclosed by the casing 5 of the interface assembly 100 and is not sucked out by a discharge fan (not shown in the figure) provided inside the test head 13. Therefore, the dry gas introduced between the test head 13 and probe card 10 is guided to the probe card 10 without dilution, and the appearance of condensation on the probe card substrate section surface 10b can be prevented.

As described hereinabove, with the interface 20 in accordance with the present invention, the dry gas that is introduced between the test head 13 and probe card 10 and leaks into the test head 13 can be enclosed. Therefore, the dry gas can be prevented from being released to the outside of the test head 13.

Furthermore, with the dry gas enclosing apparatus 200 in accordance with the present invention, the dry gas introduced between the test head 13 and probe card 10 can be prevented form being diluted. Therefore, condensation on the substrate section surface 10b of the probe card 10 can be efficiently prevented with a smaller amount of dry gas.

The present invention is obviously not limited to the above-described embodiment and can be modified in a variety of ways within the scope of the technical concept thereof.

For example, a membrane probe or other contact probes may be used instead of the probing needle.

What is claimed is:

1. An interface assembly provided at a test head, for connecting a probe card having a mating coaxial connector to the test head, the interface assembly being in communication with a dry gas generator for selectively introducing a dry gas therebetween the test head and probe card, the interface assembly comprising:

an interface comprising an interface body, wherein the interface body has a first surface and an opposed second surface and a plurality of openings being defined therethrough the interface body, and at least one coaxial connector mounted therein a respective opening of the plurality of openings and extending outwardly therefrom the first surface of the interface body, wherein the at least one coaxial connector is configured to selectively engage the mating coaxial connector of the probe card;

a casing having an annular open edge;

a ring plate comprising an annular plate section that defines an annular opening and a support column that surrounds the annular opening and extends upwardly therefrom a plane bisecting the annular plate section, wherein the annular plate section of the ring plate is sealingly connected to the annular open edge of the casing; and a means for mounting the interface body thereon at least a portion of the support column of the ring plate so that at least one first gap is formed therebetween a portion of at least one of the plurality of openings of the interface body and at least a portion of the support column and so that the second surface of the interface body overlies the annular opening of the ring plate and is substantially parallel to and spaced from the plane bisecting the annular plate section of the ring plate so that a second gap is formed therebetween the interface body and the ring plate, wherein the first gap is in fluid communication with the dry gas and an interior of the casing, wherein the first gap is in fluid communication with the second gap, wherein, in a state where the coaxial connector is engaged with the mating coaxial connector of the probe card, the means for mounting the interface body thereon at least a portion of the support column of the ring plate provides a means for preventing the occurrence on condensation on at least a portion of the probe card.

2. The interface assembly according to claim 1, wherein the means for mounting the interface body thereon at least a portion of the support column of the ring plate is configured to allow for perpendicular movement of the interface body with respect to the support column of the ring member.

3. A dry gas enclosing apparatus comprising:

an interface assembly provided at a test head, for connecting a probe card to the test head, the interface assembly comprising:

an interface comprising an interface body, wherein the interface body has a first surface and an opposed second surface and a plurality of openings being defined therethrough the interface body, and at least one coaxial connector mounted therein a respective opening of the plurality of openings and extending outwardly therefrom the first surface of the interface body, wherein the at least one coaxial connector is configured to selectively engage the mating coaxial connector of the probe card;

a casing having an annular open edge;

a ring plate comprising an annular plate section that defines an annular opening and a support column that surrounds the annular opening and extends upwardly therefrom a plane bisecting the annular plate section, wherein the annular plate section of the ring plate is sealingly connected to the annular open edge of the casing; and a means for mounting the interface body thereon at least a portion of the support column of the ring plate so that at least one first gap is formed therebetween a portion of at least one of the plurality of openings of the interface body and at least a portion of the support column and so that the second surface of the interface body overlies the annular opening of the ring plate and is substantially parallel to and spaced from the plane bisecting the annular plate section of the ring plate so that a second gap is formed therebetween the interface body and the ring plate, wherein the first gap is in fluid communication with the second gap; and a means for introducing a dry gas to the periphery of the probe card to prevent the occurrence on condensation on at least a portion of the probe card, wherein the first gap is in fluid communication with the dry gas and an interior of the casing;

a tubular member disposed around the interface and surrounding the space between the test head and the probe card in a state where the coaxial connector is engaged with the mating coaxial connector provided at the probe card.

4. The dry gas enclosing apparatus according to claim 3, further comprising a base plate disposed around the interface assembly and supporting a pogo pin, wherein the interface assembly is fixed to the test head via the base plate and wherein the tubular member is supported by the base plate and disposed to face the probe card in a state where the coaxial connector is engaged with the mating coaxial connector.

* * * * *